United States Patent
Hirashima (10) Patent No.: US 7,136,780 B2
(45) Date of Patent: Nov. 14, 2006

(54) ABNORMALITY DIAGNOSIS APPARATUS FOR AUTOMATIC ACTIVATION TIMER CIRCUIT

(75) Inventor: Osamu Hirashima, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/879,055

(22) Filed: Jun. 30, 2004

(65) Prior Publication Data

US 2005/0021304 A1    Jan. 27, 2005

(30) Foreign Application Priority Data

Jul. 2, 2003    (JP)    ............................. 2003-190270

(51) Int. Cl.
G06F 11/30    (2006.01)

(52) U.S. Cl. ...................................... 702/185; 324/379

(58) Field of Classification Search ................ 702/185; 327/379; 709/219; 324/379; 73/118.1; 714/55

See application file for complete search history.

(56) References Cited

U.S. PATENT DOCUMENTS 6,531,872 B1 *  3/2003  Carr et al. ................... 324/379
2003/0217123 A1 * 11/2003  Anderson et al. ........... 709/219

FOREIGN PATENT DOCUMENTS

| JP | 2000-329874 | 11/2000 |
| JP | 329874 | 11/2000 |
| JP | 2001-008384 | 1/2001 |
| JP | 008384 | 1/2001 |

* cited by examiner

*Primary Examiner*—John Barlow
*Assistant Examiner*—Xiuqin Sun
(74) *Attorney, Agent, or Firm*—Kenyon & Kenyon LLP (57) ABSTRACT

An abnormality diagnosis apparatus for determining whether abnormality relating to execution of automatic activation has occurred in a timer circuit. An electronic control unit includes a microcomputer for storing a history of execution of automatic activation of a device by a soak timer circuit. The microcomputer determines that an abnormality relating to execution of automatic activation has occurred in the soak timer circuit if an elapsed time measurement and the history stored by the microcomputer do not correspond with each other when a switch is operated to activate the device.

9 Claims, 5 Drawing Sheets

ABNORMALITY DIAGNOSIS APPARATUS FOR AUTOMATIC ACTIVATION TIMER CIRCUIT

BACKGROUND OF THE INVENTION

The present invention relates to an apparatus for diagnosing a circuit, and more particularly, to an apparatus for diagnosing a timer circuit that automatically activates a device.

In recent years, in a vehicle such as an automobile, installed devices, such as an engine, a transmission gear, and a brake are controlled by an electronic control unit. An abnormality diagnosis apparatus diagnoses the various devices and the electronic control unit for abnormalities. Such an abnormality diagnosis apparatus is used to improve the reliability of the vehicle. The accuracy of abnormality detection is improved by executing such detection when the condition of the vehicle is stabilized after sufficient time elapses from when the engine is stopped. For example, the abnormality diagnosis apparatus may detect whether a fuel tank has a hole from a pressure change in the fuel tank. In this case, even a subtle pressure change caused by undulation of the fuel liquid level in the fuel tank may influence the accuracy of the abnormality detection. Therefore, to ensure high accuracy in the abnormality detection, the fuel tank is diagnosed when fuel in the fuel tank is stabilized after the engine is stopped.

In a vehicle, however, power supply to equipment including the various devices and an electronic control unit is normally cut after the driver switches off an ignition switch to stop the engine. Since the abnormality diagnosis apparatus is also deactivated, the abnormality diagnosis apparatus cannot execute abnormality detection after the engine is stopped. Therefore, to enable the abnormality diagnosis apparatus to execute abnormality detection after the engine is stopped, an automatic activation timer circuit may be installed in the vehicle to temporarily activate the abnormality diagnosis apparatus (and the device that is to be diagnosed when necessary) after the engine is stopped.

To be more specific, the automatic activation timer circuit bypasses the ignition switch to supply power to devices that must perform or undergo abnormality detection. Further, the automatic activation timer circuit includes a timer unit for measuring the time elapsed from when the power supply is cut by turning off the ignition switch. When the elapsed time measured by the timer unit of the automatic activation timer circuit reaches a predetermined time, the electronic control unit supplies power to the devices that must perform or undergo abnormality detection. As a result, the abnormality diagnosis apparatus is automatically activated temporarily to detect abnormalities in the various devices.

In this case, when the engine is not running, the abnormality detection may be started simply by continuing to supply power to the automatic activation timer circuit. Further, the automatic activation timer circuit, which is provided with the above-described functions, consumes an extremely small amount of power. Thus, the automatic activation timer circuit, when installed in a vehicle, enables abnormality detection to be executed after the engine is stopped, while consuming a small amount of power when the engine is not running.

In the automatic activation timer circuit, however, the timer unit, which functions to measure time, may develop an abnormality. This would result in a fault in the elapsed time measured by the timer unit. To eliminate such a problem, a process for correcting the elapsed time measured by the timer unit is proposed in Japanese Laid-Open Patent Publication No. 2000-329874. In this process, an electronic control unit is supplied with power (activated) whenever a predetermined time elapses, and a timer incorporated in a microcomputer of an electronic control unit is actuated. The time measured by the timer is compared with the elapsed time measured by a timer unit of an automatic activation timer circuit. Based on the comparison result, the elapsed time measured by the timer unit is corrected. Such correction of the elapsed time prevents the occurrence of a fault in the timer unit that would hinder the execution of the abnormality detection at the appropriate timing after the engine is stopped.

Even if an abnormality occurs in the timer unit of the automatic activation timer circuit, the correction of the elapsed time measured by the timer unit as described above would minimize problems caused by such an abnormality. In the automatic activation timer circuit, however, an abnormality may occur in parts other than the timer unit that are related with the execution of automatic activation. For example, an abnormality may occur in a part controlling automatic activation. As another possibility, a wire breakage may occur in a signal line within the automatic activation timer circuit. If such an abnormality occurs, the abnormality diagnosis apparatus may be automatically activated before the elapsed time measured by the timer unit reaches a predetermined time. As another possibility, the abnormality diagnosis apparatus may not be automatically activated even after the elapsed time reaches a predetermined time. In these cases, the abnormality diagnosis apparatus would not be properly activated automatically.

The state of the automatic activation timer circuit must be checked based on whether the abnormality diagnosis apparatus is automatically activated at the timing when the elapsed time measured by the timer unit reaches a predetermined time. Conventional techniques, however, provide no way of checking whether the abnormality diagnosis apparatus is automatically activated at that timing when the predetermined time has elapsed. In other words, conventional techniques fail to determine whether an abnormality relating to the execution of the automatic activation has occurred in the automatic activation timer circuit. Thus, conventional techniques fail to deal with cases in which the automatic activation of the abnormality diagnosis apparatus is not executed correctly because of such an abnormality.

Such problems in an automatic activation timer circuit are not limited to systems used in vehicles, such as automobiles, but may also occur in other systems that are not used in vehicles.

SUMMARY OF THE INVENTION

The present invention provides an abnormality diagnosis apparatus for determining whether an abnormality relating to execution of automatic activation has occurred in an automatic activation timer circuit.

One aspect of the present invention is an apparatus for diagnosing a timer circuit that automatically activates a device. The device is activated or deactivated when a switch is operated. The timer circuit measures the time elapsed from when the switch is operated to deactivate the device. The timer circuit automatically activates the device temporarily when the elapsed time measurement exceeds a predetermined time. The apparatus includes a storage unit for storing a history of execution of automatic activation of the device by the timer circuit. A determination unit receives the stored history of execution and determines that an abnormality relating to the execution of automatic activation has occurred in the timer circuit if the elapsed time measurement and the history stored by the storage unit do not correspond with each other when the switch is operated to activate the device.

Further aspect of the present invention is an apparatus for diagnosing a timer circuit that automatically activates a device. The device is activated or deactivated when a switch is operated. The timer circuit measures the time elapsed from when the switch is operated to deactivate the device. The timer circuit automatically activates the device temporarily when the elapsed time measurement exceeds a predetermined time. The apparatus includes a storage means for storing a history of execution of automatic activation of the device by the timer circuit. A determination means receives the stored history of execution and determines that an abnormality relating to the execution of automatic activation has occurred in the timer circuit if the elapsed time measurement and the history stored by the storage unit do not correspond with each other when the switch is operated to activate the device.

A further aspect of the present invention is a method for diagnosing a timer circuit that automatically activates a device. The device is activated or deactivated when a switch is operated. The timer circuit measures the time elapsed from when the switch is operated to deactivate the device. The timer circuit automatically activates the device temporarily when the elapsed time measurement exceeds a predetermined time. The method includes storing a history of execution of automatic activation of the device by the timer circuit, determining whether the elapsed time measurement and the stored history do not correspond with each other when the switch is operated to activate the device, and determining that an abnormality relating to the execution of automatic activation has occurred in the timer circuit when the elapsed time measurement and the stored history do not correspond with each other.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

An electronic control unit (ECU) 1 according to a preferred embodiment of the present invention will now be described with reference to FIGS. 1 to 6. In a preferred embodiment, the ECU 1 is installed in a vehicle such as an automobile.

Figure 1:
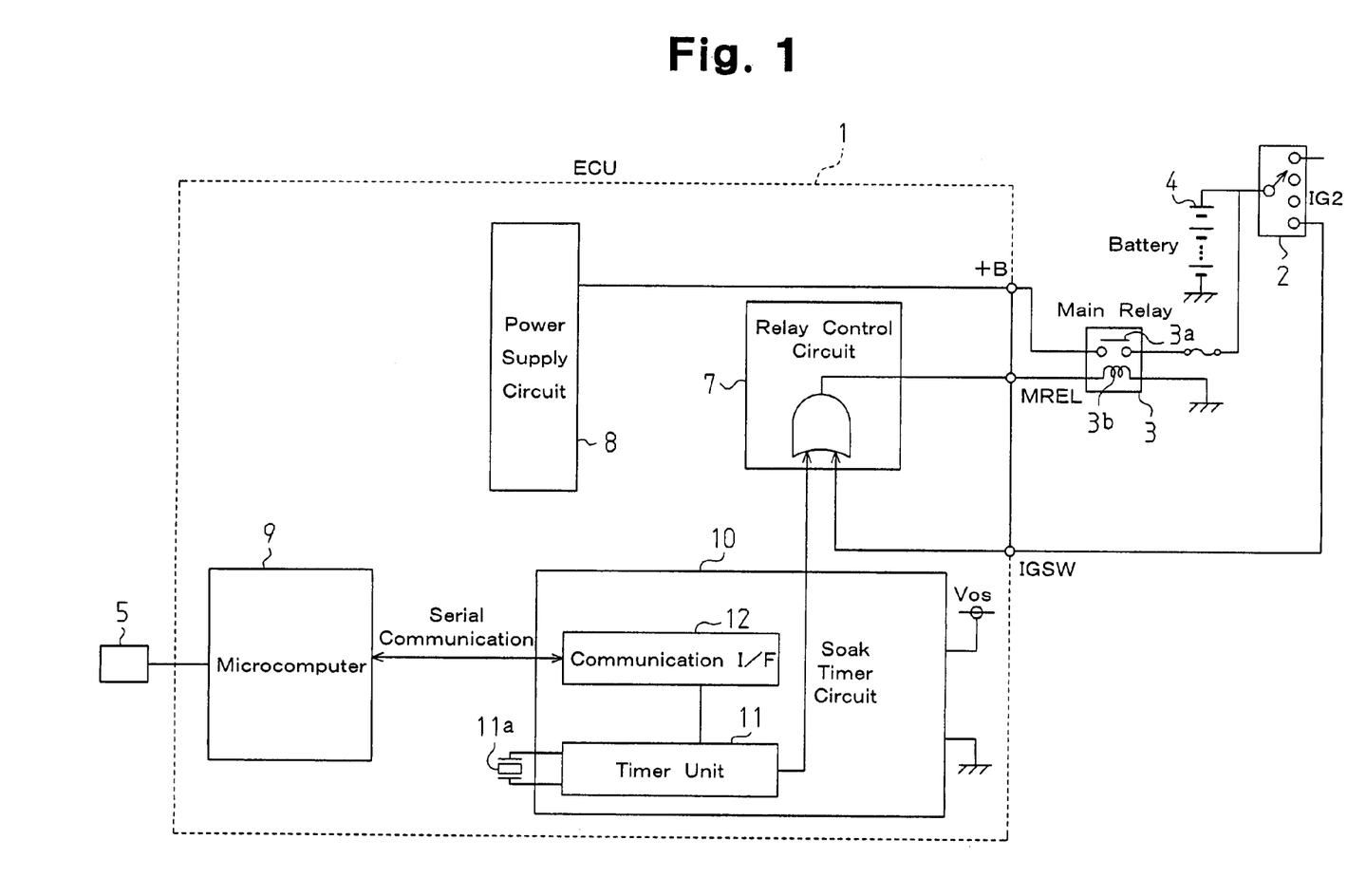
FIG. 1 is a schematic block diagram of an electronic control unit according to a preferred embodiment of the present invention.

As shown in FIG. 1, an ignition switch 2, a main relay 3, a battery 4, and various vehicle-installed devices 5 are connected to the ECU 1. The ignition switch 2 and a relay switch 3a of the main relay 3 are connected to the battery 4. When one of the two switches 2 and 3a is switched on, power is supplied to the ECU 1 and the devices 5.

The vehicle-installed devices 5 include, for example, a fuel injection valve for supplying fuel to an engine of the automobile, and various sensors for detecting the driving state of the engine. Further, the vehicle-installed devices 5 include devices activated when the automobile undergoes diagnosis, and a warning lamp for notifying a passenger of the vehicle of an abnormality when the vehicle is diagnosed as having an abnormality.

The ECU 1 includes a relay control circuit 7, a power supply circuit 8, a microcomputer 9, and a soak timer circuit 10. The relay control circuit 7 is connected to a relay coil 3b of the main relay 3 and used to drive the main relay 3. The relay switch 3a of the main relay 3 is switched on when the relay control circuit 7 provides the relay coil 3b with a signal so that the battery 4 supplies power to the ECU 1 and the vehicle-installed devices 5. In this way, the power supply circuit 8 supplies power to various devices included in the ECU 1 when the ECU 1 is supplied with power.

The microcomputer 9 functions as a storage unit and a determination unit, and includes a CPU, a ROM, a RAM, an input/output circuit, and a backup RAM. When the ECU 1 is supplied with power, the microcomputer 9 is activated and executes basic controls such as fuel injection amount control and ignition timing control of the engine. When a predetermined time elapses from the stopping of the engine, the microcomputer 9 executes some abnormality diagnoses of the automobile, such as an abnormality diagnosis for checking whether there is a hole in the fuel tank of the automobile.

After the engine is stopped, the ignition switch 2 is set in an off state to cut power supply to the devices, including the ECU 1, that are to be activated when the abnormality diagnosis is executed. To enable the abnormality diagnosis to be executed when a predetermined time elapses from the stopping of the engine, the ECU 1 (the microcomputer 9, etc.) and the devices that are operated during the abnormality diagnosis (specific devices) among the vehicle-installed devices 5 must be supplied with power and activated. The soak timer circuit 10 of the ECU 1 automatically activates the ECU 1 and the specific devices when a predetermined time elapses from the stopping of the engine (automatic activation control).

The following describes the soak timer circuit 10 in detail.

The soak timer circuit 10, which includes a CPU, a ROM, a RAM, and an input/output circuit, is constantly supplied with power by the battery 4 regardless of whether the ignition switch 2 is in an on state or an off state. The soak timer circuit 10 includes a timer unit 11, which includes an oscillator 11a such as a crystal oscillator, and a communication interface 12, which performs serial communication with the microcomputer 9. The timer unit 11 counts the number of oscillations of the oscillator 11a to measure the time elapsed from when the engine is stopped (from when the devices such as the microcomputer 9 are deactivated).

The soak timer circuit 10 is connected to the relay coil 3b of the main relay 3 via the relay control circuit 7.

Figure 2:
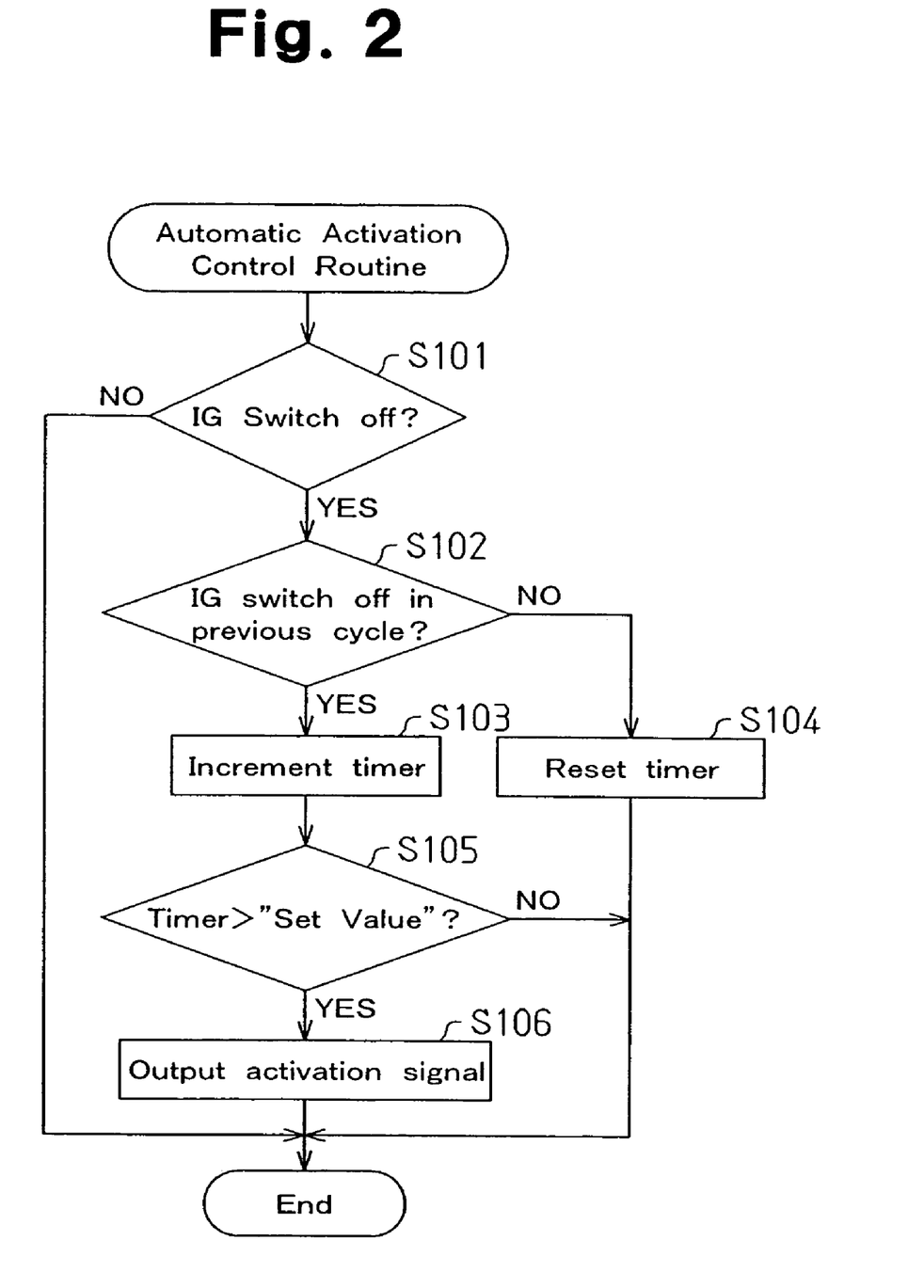
FIG. 2 is a flowchart showing the procedure of automatic activation control executed by a soak timer circuit in FIG. 1.

The automatic activation control will now be described with reference to the flowchart in FIG. 2, which shows an automatic activation control routine. The soak timer circuit 10 executes the automatic activation control routine in interrupts at a predetermined time interval based on the counted number of oscillations of the oscillator 11a of the timer unit 11.

The soak timer circuit 10 determines whether the ignition switch 2 is off in step S101. When the determination result in step S101 is affirmative, the soak timer circuit 10 proceeds to step S102 and determines whether the ignition switch 2 was off in step S101 during the previous cycle of the automatic activation control routine. When the determination result in step S102 is negative, the soak timer circuit 10 determines that the ignition switch 2 has just been switched from on to off. Thus, the timer unit 11 resets its timer count (step S104). The timer count indicates the elapsed time from when the ignition switch 2 is switched off (from when the engine is stopped).

At the same time as when the timer unit 11 resets its timer count, the soak timer circuit 10 provides the microcomputer 9 with a signal indicating that the ignition switch 2 has been switched off. In response to the signal from the soak timer circuit 10, the microcomputer 9 provides the soak timer circuit 10 with a signal indicating a predetermined automatic activation set time. Simultaneously, the microcomputer 9 terminates various processes that are presently being executed (termination mode). The automatic activation set time is set in accordance with the time required for the condition of the vehicle to sufficiently stabilize after the engine is stopped (e.g., five hours).

Subsequently, the soak timer circuit 10 stores the automatic activation set time and stops providing the relay coil 3b of the main relay 3 with a signal via the relay control circuit 7. When the signal provided to the relay coil 3b is stopped, the relay switch 3a of the main relay 3 is switched off. This cuts power supply to the ECU 1 and to the devices 5 from the battery 4 via the relay switch 3a. The microcomputer 9 of the ECU 1 executes a predetermined process during a short period after the ignition switch 2 is turned off. After executing the predetermined process, the microcomputer 9 completely stops operating.

When the processing of step S104 is executed, the soak timer circuit 10 makes an affirmative determination in step S102 of the next automatic activation control routine, determining that the ignition switch 2 is still in an off state. Then, in step S103, the timer unit 11 of the soak timer circuit 10 increments the timer count. Afterwards, the timer unit 11 repeatedly increments the timer count until the driver switches on the ignition switch 2. In step S105, the soak timer circuit 10 determines whether the timer count is greater than a set value corresponding to the automatic activation set time (five hours in the preferred embodiment). When the timer count is greater than the set value ("YES" in step S105), the soak timer circuit 10 provides the relay coil 3b of the main relay 3 with a signal via the relay control circuit 7 (step S106). When the relay coil 3b is provided with the signal from the soak timer circuit 10, the relay switch 3a of the main relay 3 is switched on, and the ECU 1 and the specific devices are automatically activated by the supply of power from the battery 4.

To store the history of automatic activation executed by the soak timer circuit 10, the microcomputer 9 of the ECU 1, which has been automatically activated, stores "1" (automatic activation executed) as a flag F in a predetermined section of its backup RAM. The flag F is reset to "0" (automatic activation not executed) when the engine is running. Further, the microcomputer 9, which has been automatically activated, executes only abnormality diagnosis of the automobile, such as an abnormality diagnosis that checks for a hole in the fuel tank, using the specific devices. After completing the abnormality diagnosis, the microcomputer 9 provides the soak timer circuit 10 with a signal to terminate the automatic activation. In response to the signal, the soak timer circuit 10 stops providing the relay coil 3b of the main relay 3 with a signal via the relay control circuit 7. As a result, the relay switch 3a of the main relay 3 is switched off. This cuts the supply of power to the ECU 1 and the specific devices from the battery 4 via the relay switch 3a. In this way, the automatic activation control is terminated.

Figure 3:
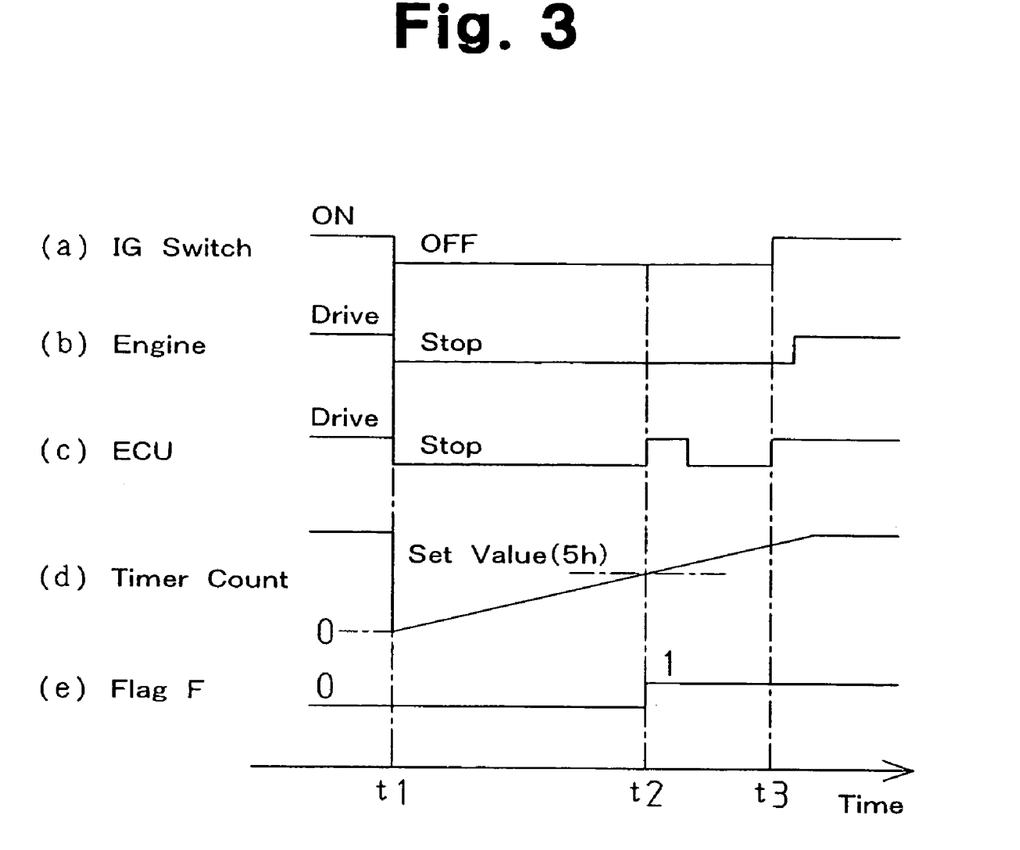
FIGS. 3, 4, and 5 are time charts showing the operation mode of an ignition switch, the drive modes of an engine and an electronic control unit, the transition of a timer count, and the setting of a flag F from stopping to starting of an engine.

The setting of the flag F when executing the automatic activation control will now be described with reference to the time charts shown in FIG. 3. In FIG. 3, (a) to (e) show the operation mode of the ignition switch 2, the driving modes of the engine and the ECU 1, the transition of the timer count, and the setting of the flag F from when the engine is stopped to when the engine is started.

As shown in FIG. 3, when the driver switches the ignition switch 2 from on to off at timing t1, the engine is stopped, the ECU 1 is deactivated, and the timer count is reset to "0". The timer count gradually increases as time elapses from when the ignition switch 2 is switched off. When the timer count exceeds the set value (timing t2), the ECU 1 and the specific devices are automatically activated by the supply of power from the battery 4. The abnormality diagnosis of the automobile is executed during the automatic activation. Afterwards, the supply of power to the ECU 1 and the specific devices is cut to terminate the automatic activation.

As described above, when the automatic activation is executed, "1" (automatic activation executed) is stored as the flag F in a predetermined section of the backup RAM of the microcomputer 9. When the flag F is "1", this indicates that the automatic activation has been executed when the engine was not running. If the driver switches the ignition switch 2 from off to on (timing t3) after the automatic activation is terminated, the ECU 1 is activated and the engine is started.

The value of the flag F set when the ignition switch 2 is switched from off to on depends on the timing when the ignition switch 2 is switched. For example, the driver may switch the ignition switch 2 from off to on before the timer count exceeds the set value. In this case, the flag F is set at "0" (automatic activation not executed) because the automatic activation control for abnormality diagnosis has not yet been executed. Alternatively, the driver may switch the ignition switch 2 from off to on after the timer count exceeds the set value. In this case, the flag F is set at "1" (automatic activation executed) because the automatic activation control for abnormality diagnosis has already been executed.

Accordingly, if the soak timer circuit 10 properly executes the automatic activation control after the engine is stopped, the timer count and the flag F have relationships as described below in relationships [1] and [2] at the timing when the ignition switch 2 is switched from off to on.

[1] The flag F is set at "0" (automatic activation not executed) when the timer count is less than or equal to the set value.

[2] The flag F is set at "1" (automatic activation executed) when the timer count is greater than the set value.

In the preferred embodiment, the above relationships in [1] and [2] are important. If neither the relationship [1] nor

[2] is satisfied when the ignition switch 2 is switched from off to on, an abnormality relating to execution of automatic activation is considered to have occurred in the soak timer circuit 10. To be more specific, when an abnormality relating to the execution of automatic activation has occurred in the soak timer circuit 10, the soak timer circuit 10 may automatically activate the ECU 1 and the specific devices before the automatic activation set time elapses from when the engine is stopped. As another possibility, the soak timer circuit 10 may not automatically activate the ECU 1 and the specific devices even after the automatic activation set time elapses from when the engine is stopped. In these cases, the timer count and the flag F do not correspond with each other at the timing when the ignition switch 2 is switched from off to on. Thus, the above relationships [1] and [2] are not satisfied. Accordingly, the occurrence of an abnormality relating to execution of automatic activation in the soak timer circuit 10 may be determined based on the relationships [1] and [2].

Figure 4:
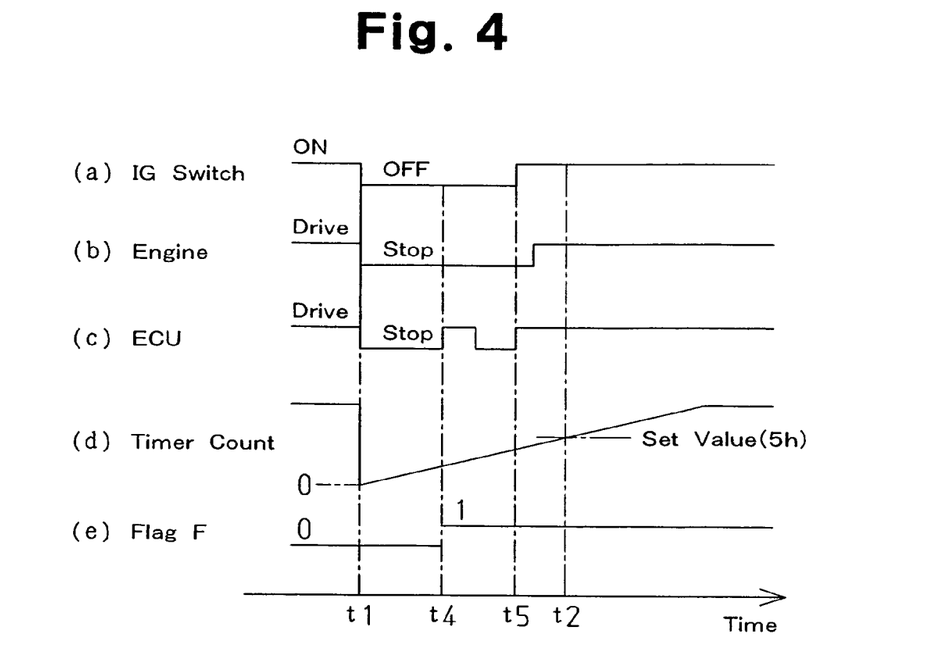

An example in which an abnormality in the soak timer circuit 10 results in the execution of the automatic activation before the automatic activation set time elapses from when the engine is stopped will now be discussed with reference to the time charts shown in FIG. 4. In FIG. 4, (a) to (e) show the operation mode of the ignition switch 2, the driving modes of the engine and the ECU 1, the transition of the timer count, and the setting of the flag F from when the engine is stopped to when the engine is started.

The driver first switches the ignition switch 2 from on to off at timing t1. Afterwards, the ECU 1 and the specific devices are automatically activated (timing t4) before the timer count exceeds the set value (timing t2) because of the abnormality in the soak timer circuit 10. This sets the flag F at "1" (automatic activation executed). Such an abnormality in the soak timer circuit 10, that is, an abnormality relating to execution of automatic activation, may be an abnormality of the part controlling automatic activation in the soak timer circuit 10.

For example, the driver may switch on the ignition switch 2 at timing t5, which is before the timing when the timer count exceeds the set value (timing t2). In this case, the occurrence of an abnormality relating to execution of automatic activation in the soak timer circuit 10 is determined. When the soak timer circuit 10 functions properly and the driver switches on the ignition switch 2 at timing t5, the flag F is supposed to be set at "0" (automatic activation not executed). In FIG. 4, however, the automatic activation is executed at timing t4 because of an abnormality occurring in the soak timer circuit 10. Thus, the flag F is set at "1" (automatic activation executed). Accordingly, in the example of FIG. 4, the flag F is set at "1" although the timer count is less than or equal to the set value. In other words, the timer count and the flag F do not correspond with each other, and the above relationship [1] is not satisfied. As a result, based on the fact that the relationship [1] is not satisfied, an abnormality relating to execution of automatic activation is determined to have occurred in the soak timer circuit 10.

Figure 5:
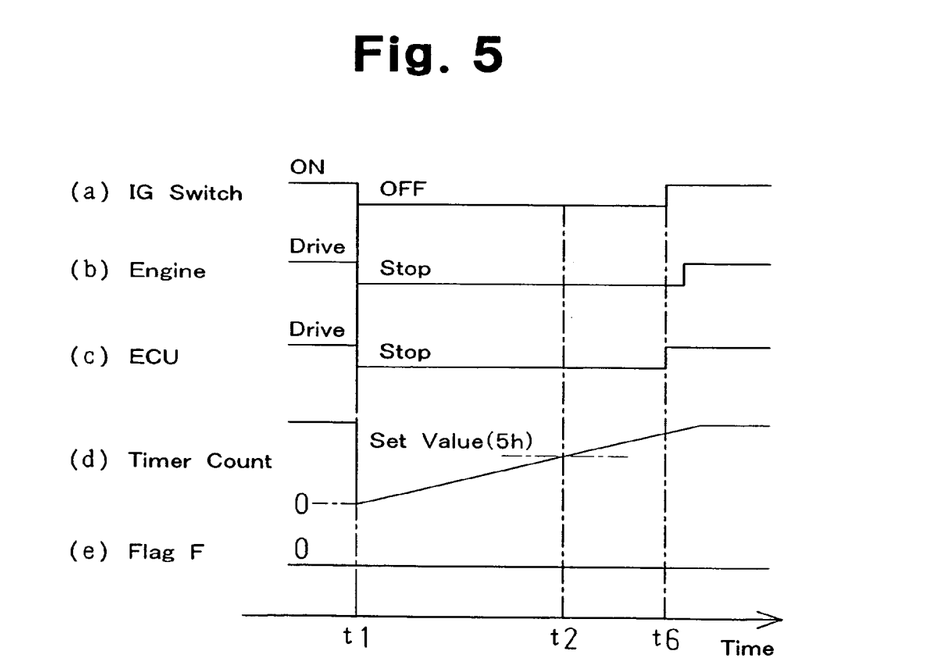

An example in which the automatic activation is not executed even after the automatic activation set time elapses from when the engine is stopped because of an abnormality in the soak timer circuit 10 will now be discussed with reference to the time charts shown in FIG. 5. In FIG. 5, (a) to (e) show the operation mode of the ignition switch 2, the driving modes of the engine and the ECU 1, the transition of the timer count, and the setting of the flag F from when the engine is stopped to when the engine is started.

The driver first switches the ignition switch 2 from on to off at timing t1. Afterwards, the ECU 1 and the specific devices are not automatically activated even after the timer count exceeds the set value (timing t2) because of an abnormality in the soak timer circuit 10, and the flag F remains set at "0" (automatic activation not executed). Such an abnormality occurring in the soak timer circuit 10, that is, an abnormality relating to execution of automatic activation, may be a breakage in a signal line of the soak timer circuit 10.

For example, the driver may switch on the ignition switch 2 at timing t6, which is after the timing when the timer count exceeds the set value (timing t2). In this case, the occurrence of an abnormality relating to execution of automatic activation in the soak timer circuit 10 is determined. When the soak timer circuit 10 functions properly and the driver switches on the ignition switch 2 at timing t6, the flag F is supposed to be set at "1" (automatic activation executed). In FIG. 5, however, the automatic activation is not executed because of an abnormality in the soak timer circuit 10. Thus, in the example of FIG. 5, the flag F remains set at "0" (automatic activation not executed) even when the timer count becomes greater than the set value. As a result, the timer count and the flag F do not correspond with each other, and the relationship [2] is not satisfied. Based on the fact that the relationship [2] is not satisfied, an abnormality relating to execution of automatic activation is determined to have occurred in the soak timer circuit 10.

Figure 6:
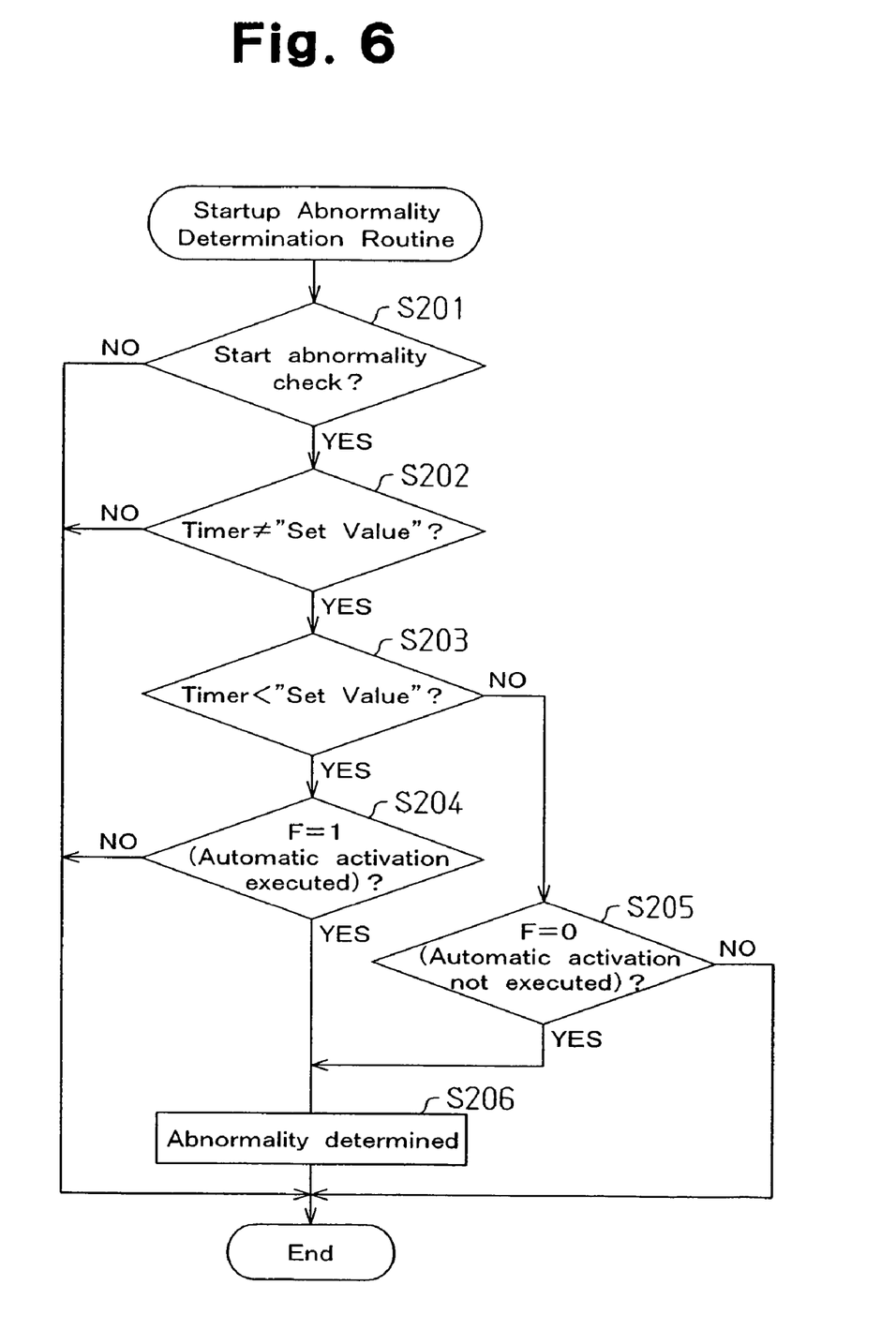
FIG. 6 is a flowchart showing an abnormality determination procedure for determining whether an abnormality relating to execution of automatic activation has occurred in the soak timer circuit.

A procedure for determining whether an abnormality relating to automatic activation has occurred in the soak timer circuit 10 will now be discussed with reference to FIG. 6 showing a flowchart of a startup abnormality determination routine. When the driver switches on the ignition switch 2, the microcomputer 9 is activated and executes an initialization process. The microcomputer 9 executes the startup abnormality determination routine as a part of the initialization process.

In the startup abnormality determination routine, the microcomputer 9 first determines whether the soak timer circuit 10 should be checked for abnormalities. That is, the microcomputer 9 determines whether the ignition switch 2 has been switched from off to on (step S201). When the determination result in step S201 is affirmative, the microcomputer 9 determines whether or not the present timer count in the timer unit 11 is equal to the set value in step S202. When the timer count is not equal to the set value, the microcomputer 9 proceeds to step S203 to subsequently determine whether an abnormality has occurred.

In step S203, the microcomputer 9 determines whether the timer count is less than the set value. When the determination result in step S203 is affirmative, the microcomputer 9 determines whether the flag F is set at "1" (automatic activation executed) in step S204. When the determination result in step S204 is affirmative, the microcomputer 9 determines that an abnormality relating to execution of automatic activation has occurred in the soak timer circuit 10 (step S206).

When the determination result in step S203 is negative, the microcomputer 9 determines whether the flag F is set at "0" (automatic activation not executed) in step S205. When the determination result in step S205 is affirmative, the microcomputer 9 determines that an abnormality relating to execution of automatic activation has occurred in the soak timer circuit 10 (step S206).

After an abnormality is determined to have occurred in the soak timer circuit 10 in step S206, the microcomputer 9 stores the abnormality determination result. Further, the microcomputer 9 lights the warning lamp of the automobile to notify the driver that an abnormality relating to execution of automatic activation has occurred in the soak timer circuit 10.

When the flag F is not set at "1" (automatic activation executed) in step S204 or when the flag F is not set at "0" (automatic activation not executed) in step S205, the microcomputer 9 does not determine that an abnormality relating to execution of automatic activation has occurred in the soak timer circuit 10.

The ECU 1 of the preferred embodiment has the advantages described below.

(1) Because of an abnormality relating to execution of automatic activation, the soak timer circuit 10 may execute the automatic activation before the timer count exceeds the set value or may not execute the automatic activation even after the timer count exceeds the set value. In such cases, when the ignition switch 2 is switched from off to on, the timer count and the flag F do not correspond with each other and the above relationships [1] and [2] are not satisfied. Based on the fact that the relationship [1] or [2] is not satisfied, the microcomputer 9 determines that an abnormality relating to execution of automatic activation has occurred in the soak timer circuit 10. The microcomputer 9 then lights the warning lamp of the automobile to notify the driver that an abnormality relating to execution of automatic activation has occurred in the soak timer circuit 10. This enables the driver to cope with the abnormality.

(2) If the ignition switch 2 is switched from off to on when the soak timer circuit 10 is properly functioning, the timer count and the flag F correspond with each other. The microcomputer 9 does not determine that an abnormality relating to the automatic activation has occurred in the soak timer circuit 10 when the above relationship [1] or [2] is satisfied. This prevents the microcomputer 9 from erroneously determining that an abnormality has occurred.

It should be apparent to those skilled in the art that the present invention may be embodied in many other specific forms without departing from the spirit or scope of the invention. Particularly, it should be understood that the present invention may be embodied in the following forms.

In a preferred embodiment, the fuel tank is checked for a hole when the abnormality diagnosis is executed after the engine is stopped. However, other types of abnormality diagnoses may be executed after the engine is stopped. In such a case, the automatic activation set time is not limited to five hours and may be changed in accordance with the abnormality diagnosis that is executed.

In a preferred embodiment, the soak timer circuit 10 automatically activates the ECU 1 and the various devices used for an abnormality diagnosis in the automobile. However, the soak timer circuit 10 may automatically activate other devices.

The present invention is not limited to a system for a vehicle, such as an automobile, and may be applied to other systems.

The present examples and embodiments are to be considered as illustrative and not restrictive, and the invention is not to be limited to the details given herein, but may be modified within the scope and equivalence of the appended claims.

What is claimed is:

1. An apparatus for diagnosing a timer circuit that automatically activates a device, the device being activated or deactivated when a switch is operated, the timer circuit measuring the time elapsed from when the switch is operated to deactivate the device, and the timer circuit automatically activating the device temporarily when the elapsed time measurement exceeds a predetermined time, the apparatus comprising:

a storage unit for storing a history of execution of automatic activation of the device by the timer circuit; and a determination unit which receives the stored history of execution and determines that an abnormality relating to the execution of automatic activation has occurred in the timer circuit if the elapsed time measurement and the history stored by the storage unit do not correspond with each other when the switch is operated to activate the device, wherein the determination unit determines that an abnormality relating to the execution of automatic activation has occurred in the timer circuit if the elapsed time measurement is shorter than the predetermined time and the storage unit stores the history of execution of automatic activation of the device by the timer circuit when the switch is operated to activate the device, and wherein the determination unit determines that an abnormality relating to the execution of automatic activation has not occurred in the timer circuit if the elapsed time measurement is shorter than the predetermined time and the storage unit does not store the history of execution of automatic activation of the device by the timer circuit when the switch is operated to activate the device.

2. The apparatus according to claim 1, wherein:

the storage unit holds the history of execution of automatic activation by the timer circuit during deactivation of the device; and the determination unit determines that an abnormality relating to the execution of automatic activation has occurred in the timer circuit if the elapsed time measurement and the history stored by the storage unit do not correspond with each other when the switch is operated to activate the device after deactivation of the device.

3. The apparatus according to claim 1, wherein the determination unit determines that an abnormality relating to the execution of automatic activation has occurred in the timer circuit if the elapsed time measurement is longer than the predetermined time and the storage unit does not store the history of execution of automatic activation of the device by the timer circuit when the switch is operated to activate the device.

4. The apparatus according to claim 3, wherein the determination unit determines that an abnormality relating to the execution of automatic activation has not occurred in the timer circuit if the elapsed time measurement is longer than the predetermined time and the storage unit stores the history of execution of automatic activation of the device by the timer circuit when the switch is operated to activate the device.

5. An apparatus for diagnosing a timer circuit that automatically activates a device, the device being activated or deactivated when a switch is operated, the timer circuit measuring the time elapsed from when the switch is operated to deactivate the device, and the timer circuit automatically activating the device temporarily when the elapsed time measurement exceeds a predetermined time, the apparatus comprising:

a storage means for storing a history of execution of automatic activation of the device by the timer circuit; and a determination means, receiving the stored history of execution, for determining that an abnormality relating to the execution of automatic activation has occurred in the timer circuit if the elapsed time measurement and the history stored by the storage unit do not correspond with each other when the switch is operated to activate the devices, wherein said determination means determines that the elapsed time measurement and the stored history do not correspond with each other when the elapsed time has not exceeded the predetermined time and the history is stored, and wherein said determination means determines that the elapsed time measurement and the stored history correspond with each other when the elapsed time has not exceeded the predetermined time and the history is not stored.

6. A method for diagnosing a timer circuit that automatically activates a device, the device being activated or deactivated when a switch is operated, the timer circuit measuring the time elapsed from when the switch is operated to deactivate the device, and the timer circuit automatically activating the device temporarily when the elapsed time measurement exceeds a predetermined time, the method comprising:

storing a history of execution of automatic activation of the device by the timer circuit;

determining whether the elapsed time measurement and the stored history do not correspond with each other when the switch is operated to activate the device; and determining that an abnormality relating to the execution of automatic activation has occurred in the timer circuit when the elapsed time measurement and the stored history do not correspond with each other, wherein said determining whether the elapsed time measurement and the stored history do not correspond with each other includes determining that the elapsed time measurement and the stored history do not correspond with each other when the elapsed time has not exceeded the predetermined time and the history is stored, and wherein said determining whether the elapsed time measurement and the stored history do not correspond with each other includes determining that the elapsed time measurement and the stored history correspond with each other when the elapsed time has not exceeded the predetermined time and the history is not stored.

7. The method according to claim 6, wherein:

said storing a history of execution of automatic activation of the device by the timer circuit includes holding the history during deactivation of the device; and said determining whether the elapsed time measurement and the stored history do not correspond with each other includes determining whether the elapsed time measurement and the stored history do not correspond with each other when the switch is operated to activate the device after deactivation of the device.

8. The method according to claim 6, wherein said determining whether the elapsed time measurement and the stored history do not correspond with each other includes determining that the elapsed time measurement and the stored history do not correspond with each other when the elapsed time has exceeded the predetermined time and the history is not stored.

9. The method according to claim 8, wherein said determining whether the elapsed time measurement and the stored history do not correspond with each other includes determining that the elapsed time measurement and the stored history correspond with each other when the elapsed time has exceeded the predetermined time and the history is stored.

* * * * *